(12) United States Patent
Sumi

(10) Patent No.: US 7,517,713 B2
(45) Date of Patent: Apr. 14, 2009

(54) SOLID-STATE IMAGE SENSOR AND METHOD FOR MANUFACTURING THEREOF AS WELL AS SEMICONDUCTOR DEVICE AND METHOD FOR MANUFACTURING THEREOF

(75) Inventor: Hirofumi Sumi, Kanagawa (JP)

(73) Assignee: Sony Corporation, Tokyo (JP)

( * ) Notice: Subject to any disclaimer, the term of this patent is extended or adjusted under 35 U.S.C. 154(b) by 277 days.

(21) Appl. No.: 11/261,331

(22) Filed: Oct. 28, 2005

(65) Prior Publication Data

US 2006/0094151 A1    May 4, 2006

(30) Foreign Application Priority Data

Oct. 28, 2004    (JP)    ............... P2004-314340

(51) Int. Cl.
*H01L 21/00* (2006.01)
(52) U.S. Cl. ............. 438/57; 438/48; 257/E21.705
(58) Field of Classification Search ............... 438/57, 438/48; 257/291, 447
See application file for complete search history.

(56) References Cited

U.S. PATENT DOCUMENTS 6,169,319 B1 *    1/2001    Malinovich et al. ......... 257/447

2005/0052562 A1 *    3/2005    Shimizu et al. ............. 348/340

FOREIGN PATENT DOCUMENTS

| JP | 6-029506 | 2/1994 |
|---|---|---|
| JP | 07-240932 | 12/1995 |
| JP | 2004-242220 | 8/2004 |

* cited by examiner

*Primary Examiner*—Walter L Lindsay, Jr.
*Assistant Examiner*—Abdulfattah Mustapha
(74) *Attorney, Agent, or Firm*—K & L Gates LLP

(57) ABSTRACT

A solid-state image sensor and a method for manufacturing thereof and a semiconductor device and a method for manufacturing thereof are provided. A semiconductor substrate is made to be the thin film without using an SOI substrate and cost is reduced. An edge detection portion having hardness larger than that of a semiconductor substrate is formed in the thickness direction of the semiconductor substrate; the semiconductor substrate is made to be the thin film until a position where the edge detection portion is exposed by chemical mechanical polishing from the rear surface; and means Tr1 for reading out a signal from a photoelectric conversion element PD formed in the substrate are formed on the front surface of the semiconductor substrate, where incident light is acquired from the rear surface of the semiconductor substrate.

9 Claims, 19 Drawing Sheets

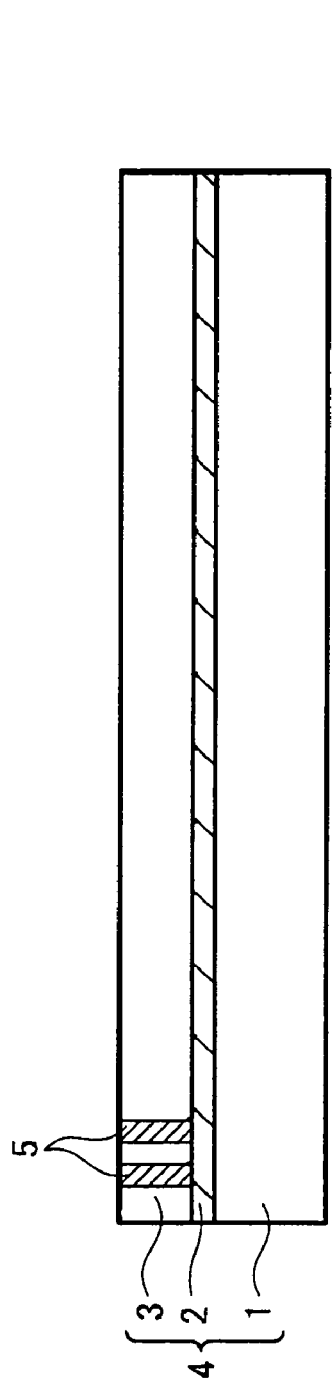
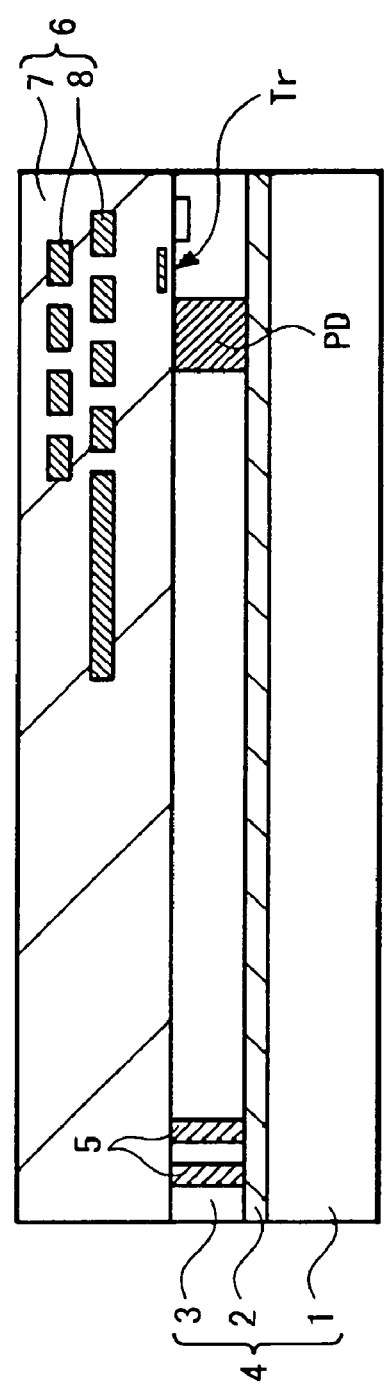
FIG. 1A (RELATED ART)
FIG. 1B (RELATED ART)

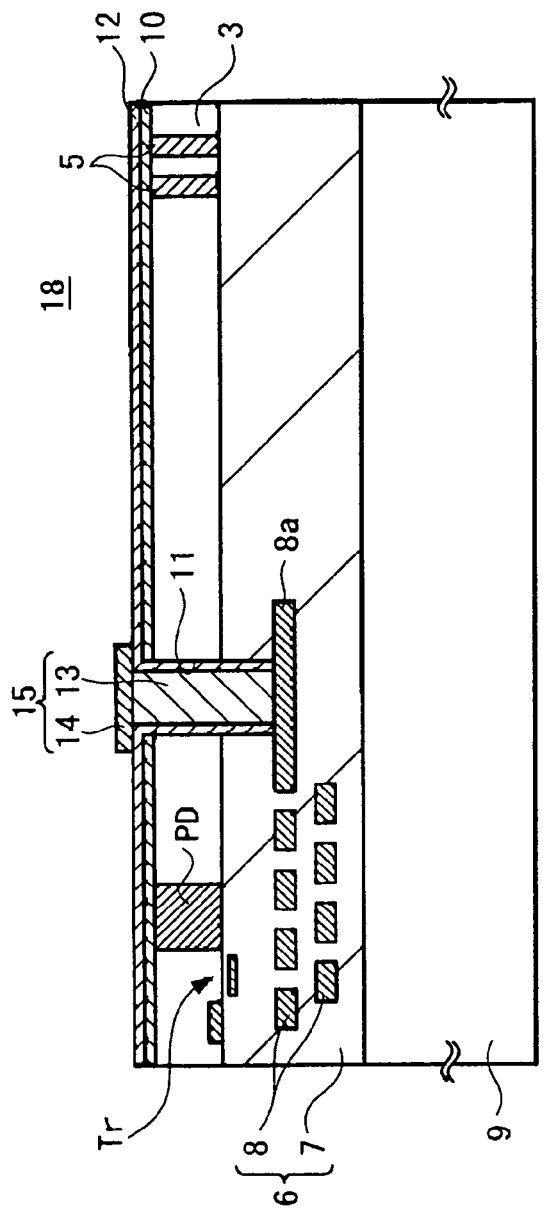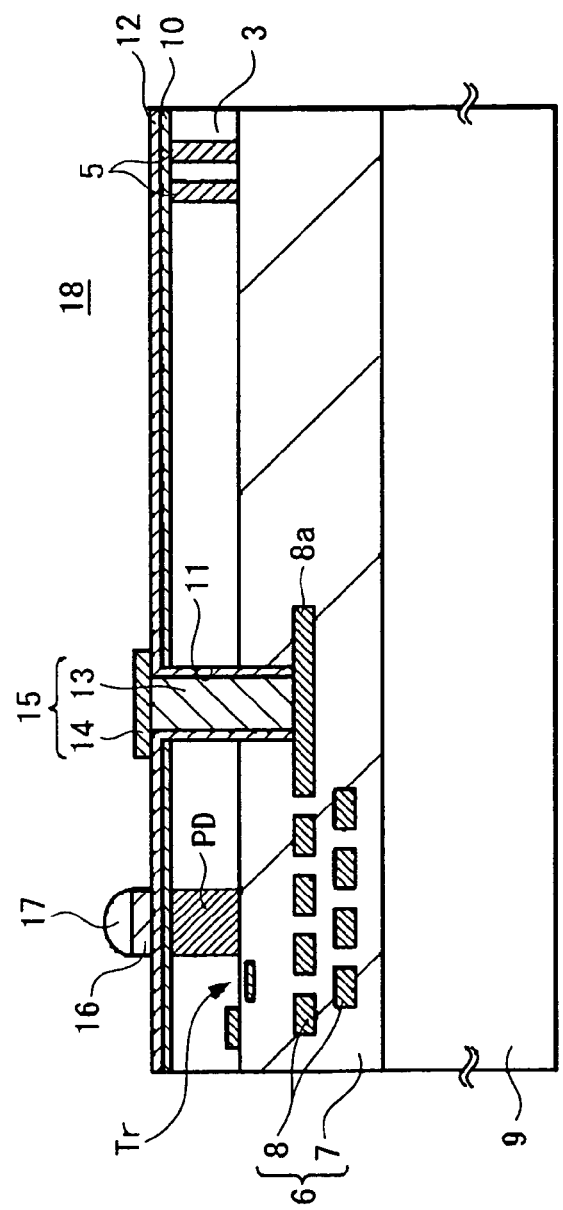
FIG. 3A (RELATED ART)
FIG. 3B (RELATED ART)

SOLID-STATE IMAGE SENSOR AND METHOD FOR MANUFACTURING THEREOF AS WELL AS SEMICONDUCTOR DEVICE AND METHOD FOR MANUFACTURING THEREOF

CROSS REFERENCES TO RELATED APPLICATIONS

The present invention claims priority to Japanese Patent Application JP 2004-314340 filed in the Japanese Patent Office on Oct. 28, 2004, the entire contents of which being incorporated herein by reference.

BACKGROUND

The present invention relates to a solid-state image sensor and a method for manufacturing thereof as well as a semiconductor device and a method for manufacturing thereof, in which a semiconductor substrate needs to be a thin film.

DESCRIPTION OF THE RELATED ART

A CMOS solid-state image sensor that designates an X-Y address to be read out and a CCD solid-state image sensor that is a charge transfer type are typical as a solid-state image sensor. In each of the solid-state image sensors, photoelectric conversion is performed on incident light into a photodiode two-dimensionally arranged and one of the electric charges (for example, electron) is made to be a signal electric charge.

With respect to the CMOS solid-state image sensor, a CMOS solid-state image sensor of a front-illuminated type in which light is illuminated from the front surface side where a wiring layer of a semiconductor substrate is formed and the light is detected by a photodiode formed on the semiconductor substrate is typical. However, in this CMOS solid-state image sensor of the front-illuminated type, it is known that efficiency in using light is reduced and sensitivity is lowered, because multi-layered wirings exist on the route of light illuminated, particularly, on the optical path of oblique light in the vicinity of the effective pixel area and the light is scattered by the multi-layered wirings. Because of this, a CMOS solid-state image sensor of a back-illuminated type is promising in which light is illuminated from the rear side of a semiconductor substrate where the multi-layered wirings are formed on the front surface side (refer to Patent Document 1).

Further, in the CCD solid-state image sensor, it is known that light is absorbed into an interlayer insulation layer on the element to reduce sensitivity and so a structure where light is illuminated from the rear side of the substrate to perform photoelectric conversion has been proposed (refer to Patent Document 2).

Patent Document 1: Published Japanese Patent Application No. 2003-31785

Patent Document 2: Published Japanese Patent Application No. H6-29506

As for a CMOS solid-state image sensor, for example, in the case where light is illuminated from the rear side of the substrate, because typically the thickness of a silicon substrate is thick such as several hundred µm not to pass the light, it is necessary to make the silicon substrate thin to be 10 µm or less. If the film thickness of the silicon layer is uneven when making a thin film, differences in the strength of incident light are caused and such inconvenience as unevenness with respect to color occurs.

On the other hand, a method using an SOI (Silicon On Insulator) substrate has been considered to prevent unevenness of the film thickness of the silicon layer. In other words, by using the SOI substrate, mechanical polishing of a high speed etching rate is applied, then CMP (Chemical Mechanical Polishing) processing is applied, and wet etching is applied and with operation of making thin film being stopped at a $SiO_2$ layer, unevenness of the film thickness of the silicon layer is prevented.

A method for manufacturing a CMOS solid-state image sensor of the back-illuminated type using the SOI substrate is explained referring to FIGS. 1 through 3.

First, as shown in FIG. 1A, an SOI substrate 4 in which a thin-film silicon layer 3 is formed on a silicon substrate 1 with a silicon oxide film ($SiO_2$ film) 2 in between is prepared. An alignment mark 5 is formed at a required position in the silicon layer 3 of this SOI substrate 4.

Next, as shown in FIG. 1B, with the alignment mark 5 used as a reference, in the silicon layer 3 from the front surface side are formed a pixel separation area in an image area (not shown), a semiconductor well area (not shown), a photodiode PD to be a photoelectric conversion element and a plurality of MOS transistors of a HAD (Hole Accumulation Diode) structure which constitute a pixel with the photodiodes PD.

Further, a multi-layered wiring layer 6 is laminated thereon in which a multi-layer wiring 8 is formed with an interlayer insulation layer 7 in between.

Next, as shown in FIG. 2A, for example, a support substrate 9 such as a silicon substrate or the like is stuck to the multi-layered wiring layer 6.

Then, as shown in FIG. 2B, the SOI substrate 4 is reversed, and the silicon substrate 1 is polished and removed by back-grinding (mechanical rough grinding) and wet-etching with the silicon oxide film 2 being used as a stopper film. Further, the silicon oxide film 2 is removed by the wet-etching.

Next, as shown in FIG. 3A, for example, a silicon nitride film 10 to be a passivation film is formed on the rear surface of the silicon layer 3, and an opening 11 that reaches a wiring layer 8a is formed by selectively etching part of the silicon layer 3 together with the silicon nitride film 10, namely at a portion where an electrode should be derived from the wiring layer 8a. Further, for example, an insulation film 12 such as a silicon oxide film is formed from the inside wall of the opening 11 to cover the surface of the silicon nitride film 10. A conductive layer 13 that connects to the wiring layer 8a inside the opening 11 is formed and an electrode pad 14 that connects to the conductive layer 13 and faces to the rear surface is formed, and what is called a rear surface electrode 15 is formed.

Next, as shown in FIG. 3B, a color filter 16 and an on-chip lens 17 are formed on the rear surface at a position corresponding to the photodiode PD of each pixel, and a CMOS solid-state image sensor of the back-illuminated type 18 is obtained.

However, in the case where the CMOS solid-state image sensor of the back-illuminated type is manufactured using the SOI substrate, there has been a problem that the manufacturing cost increases because the cost of the SOI substrate is higher than that of a silicon substrate.

The problem when using such an SOI substrate also occurs in a CCD solid-state image sensor of the back-illuminated type, and furthermore, not limited to the solid-state image sensor, the problem may also occur, for example, in a semiconductor circuit device in which a semiconductor element and/or multi-layered wiring are formed on both the front and rear surfaces of a semiconductor substrate.

SUMMARY

The present invention addresses the above-identified, and other problems associated with conventional methods and apparatuses, and provides a solid-state image sensor and a method for manufacturing thereof and a semiconductor device and a method for manufacturing thereof, in which a semiconductor substrate can be made thin without using the SOI substrate and therefore the cost can be reduced.

A solid-state image sensor according to an embodiment of the present invention is of what is called a back-illuminated type and includes an edge detection portion which is formed in a semiconductor substrate in the thickness direction from the front surface and which has hardness larger than that of the semiconductor substrate, wherein the semiconductor substrate is made to be a thin film until a position where the edge detection portion is exposed by chemical mechanical polishing from the rear surface and means for reading out a signal from a photoelectric conversion element provided in the substrate are formed on the front surface of the semiconductor substrate to acquire incident light from the rear surface of the semiconductor substrate.

A method for manufacturing a solid-state image sensor according to an embodiment of the present invention includes the processes of: forming in a semiconductor substrate an edge detection portion having hardness larger than that of the semiconductor substrate in the thickness direction from the front surface, forming part of components of the solid-state image sensor on the front surface side of the semiconductor substrate, sticking a support substrate to the front surface side of the semiconductor substrate, performing chemical mechanical polishing from the rear surface side of the semiconductor substrate and stopping the chemical mechanical polishing in a self-aligning manner when the bottom of the edge detection portion appeared on the rear surface, which makes the semiconductor substrate thin, and forming the other portion of components of the solid-state image sensor on the rear surface side of the semiconductor substrate.

In the above-described solid-state image sensor and method for manufacturing thereof, it is desirable that the edge detection portion be formed to serve also as an element separation area. It is desirable that the edge detection portion be formed with a pillar layer which is different from the element separation area.

It is desirable that the edge detection portion be formed with the length corresponding to the thickness of a photoelectric conversion element that performs photoelectric conversion by absorbing light.

It is desirable that the edge detection portion of a plurality of pillar layers be formed at an interval which prevents uneven thickness from occurring in the process of the chemical mechanical polishing.

A semiconductor device according to an embodiment of the present invention includes an edge detection portion which is formed in a semiconductor substrate in the thickness direction from the front surface and which has hardness larger than that of the semiconductor substrate, wherein the semiconductor substrate is made to be a thin film until a position where the edge detection portion is exposed by chemical mechanical polishing from the rear surface, and components of the semiconductor device are formed on the front and rear surfaces of the semiconductor substrate.

A method for manufacturing a semiconductor device according to an embodiment of the present invention includes the processes of: forming in a semiconductor substrate an edge detection portion having hardness larger than that of the semiconductor substrate in the thickness direction from the front surface, forming part of components of the semiconductor device on the front surface side of the semiconductor substrate, sticking a support substrate to the front surface side of the semiconductor substrate, performing chemical mechanical polishing from the rear surface side of the semiconductor substrate and stopping the chemical mechanical polishing in a self-aligning manner when the bottom of the edge detection portion appeared on the rear surface, which makes the semiconductor substrate thin, and forming the other portion of components of the semiconductor device on the rear surface side of the semiconductor substrate.

In the above-described semiconductor device and method for manufacturing thereof, it is desirable that the edge detection portion be formed to serve also as an element separation area. It is desirable that the edge detection portion be formed with a pillar layer which is different from the element separation area. It is desirable that an interval of the edge detection portions formed of the pillar layer be set to the interval which prevents uneven thickness from occurring when performing the chemical mechanical polishing.

According to the embodiment of the solid-state image sensor of the present invention, since the back-illuminated type structure is obtained without using the SOI substrate and with using the semiconductor substrate that is provided with the edge detection portion having large hardness and that is made thin until a position where the edge detection portion is exposed by the chemical mechanical polishing, cost can be reduced and the solid-state image sensor of the back-illuminated type with high accuracy can be provided. Since the chemical mechanical polishing is performed to make the film thin, the thin film can be made easily from the thick semiconductor substrate and the manufacturing process thereof can be simplified.

According to the embodiment of a method for manufacturing the solid-state image sensor of the present invention, since the edge detection portion having large hardness is formed in the semiconductor substrate, the chemical mechanical polishing is performed from the rear surface of the semiconductor substrate, the chemical mechanical polishing is stopped in a self-aligning manner when the bottom of the edge detection portion appeared on the rear surface and the semiconductor substrate is made thin, the semiconductor substrate can be made thin without using the SOI substrate. Therefore, the manufacturing process of the solid-state image sensor is simplified and the manufacturing cost can be reduced greatly. Further, since the chemical mechanical polishing is performed to make the film thin, the thin film can be made from the thick semiconductor substrate only by the chemical mechanical polishing and the manufacturing process can further be simplified. In the chemical mechanical polishing, treatment is performed on a large amount of slurry at normal pressures, which is advantageous to make the thin film from the thick semiconductor substrate.

When this manufacturing method is applied to the manufacture of a CMOS solid-state image sensor, general-purpose CMOS process technology can be used without any change.

The structure and manufacturing process can be simplified with forming the edge detection portion also used as the element separation area.

The solid-state image sensor of the back-illuminated type including the photoelectric conversion element in which the desired depth of the potential is obtained can be provided by forming the edge detection portion with the pillar layer which is different from the element separation area.

The semiconductor substrate corresponding to the thickness of the photoelectric conversion element can be formed by making the length in the depth direction of the edge detection portion be the length corresponding to the thickness of the photoelectric conversion element.

The semiconductor substrate made to be a thin film having uniform thickness regarding the entire surface can be obtained by forming the edge detection portion of the pillar layer at an interval which prevents the uneven thickness from occurring in the chemical mechanical polishing.

According to the embodiment of the semiconductor device of the present invention, since the semiconductor device has a structure in which components are formed both of the front and back surfaces without using the SOI substrate and with using the semiconductor substrate that is provided with the edge detection portion having large hardness and that is made thin until a position where the edge detection portion is exposed by the chemical mechanical polishing, cost can be reduced and the semiconductor device with high accuracy can be provided. Since the chemical mechanical polishing is performed to make the film thin, the thin film can be made easily from the thick semiconductor substrate and the manufacturing process thereof can be simplified.

According to the embodiment of a method for manufacturing the semiconductor device of the present invention, since the edge detection portion having large hardness is formed in the semiconductor substrate, the chemical mechanical polishing is performed from the rear surface of the semiconductor substrate, the chemical mechanical polishing is stopped in a self-aligning manner when the bottom of the edge detection portion appeared on the rear surface and the semiconductor substrate is made thin, the semiconductor substrate can be made thin without using the SOI substrate. Therefore, the manufacturing process of the semiconductor device is simplified and the manufacturing cost can be reduced greatly. Further, since the chemical mechanical polishing is performed to make the film thin, the thin film can be made from the thick semiconductor substrate only by the chemical mechanical polishing and the manufacturing process can further be simplified. In the chemical mechanical polishing, treatment is performed on a large amount of slurry at normal pressures, which is advantageous to make the thin film from the thick semiconductor substrate.

When this manufacturing method is applied to the manufacture of the CMOS solid-state image sensor, general-purpose CMOS process technology can be used without any change.

The structure and manufacturing process can be simplified with forming the edge detection portion also used as the element separation area.

The semiconductor device including components in a semiconductor substrate made to be a thin film with the desired depth can be provided by forming the edge detection portion with the pillar layer which is different from the element separation area.

The semiconductor substrate made to be a thin film having uniform thickness regarding the entire surface can be obtained by forming the edge detection portion of the pillar layer at an interval which prevents the uneven thickness from occuring in the chemical mechanical polishing.

Additional features and advantages are described herein, and will be apparent from, the following Detailed Description and the figures.

BRIEF DESCRIPTION OF THE FIGURES

FIGS. 1A and 1B are manufacturing process diagrams of a CMOS solid-state image sensor of the back-illuminated type of a comparative example.

FIGS. 3A and 3B are manufacturing process diagrams of the CMOS solid-state image sensor of the back-illuminated type of the comparative example.

DETAILED DESCRIPTION

Hereinafter, embodiments of the present invention will be explained with reference to drawings.

FIGS. 4 through 9 show the first embodiment in which a solid-state image sensor according to the present invention is applied to a CMOS solid-state image sensor of the back-illuminated type. Here, the CMOS solid-state image sensor of the back-illuminated type is explained as well as a method for manufacturing thereof.

Figures 2A, 2B:
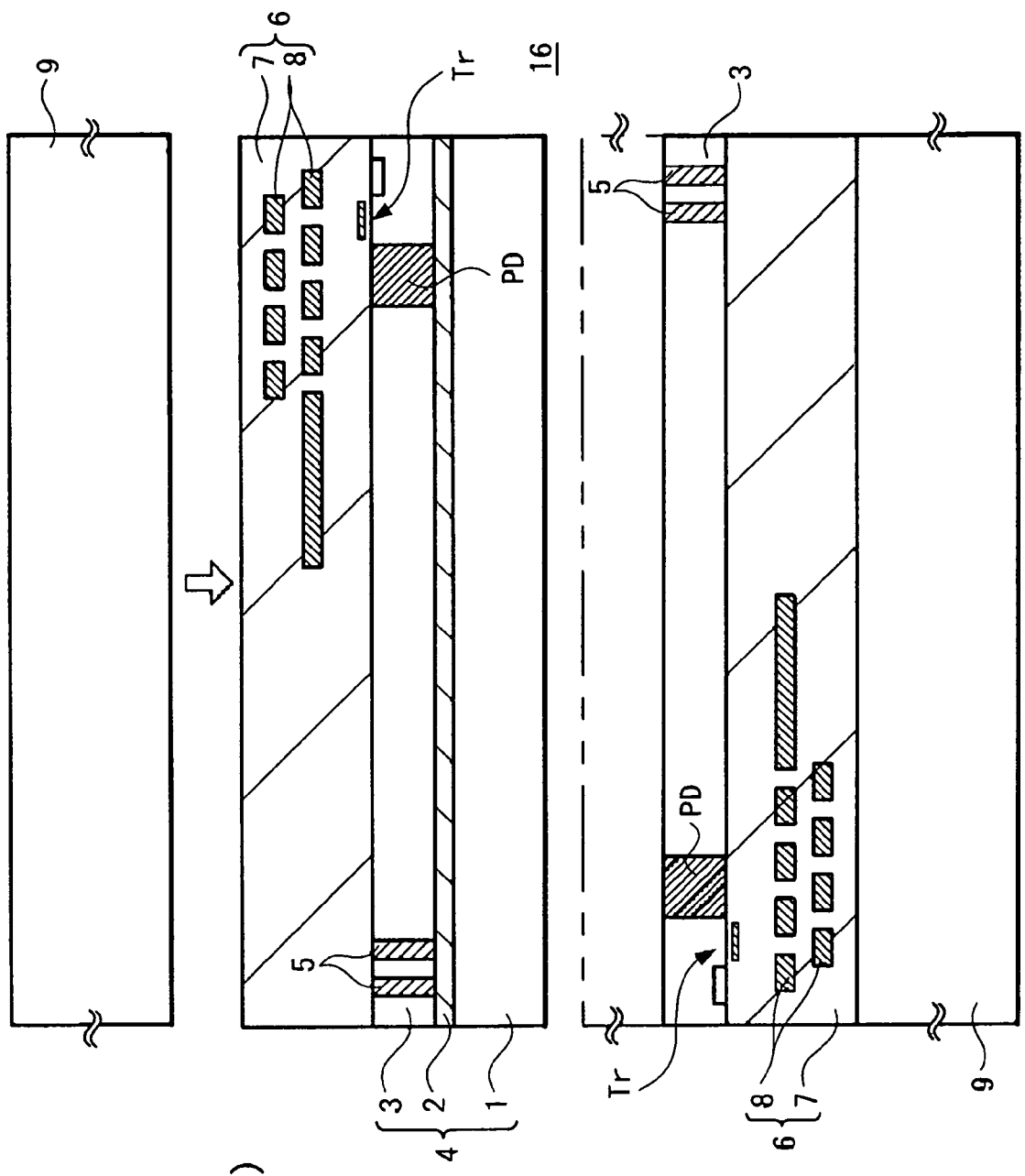
FIGS. 2A and 2B are manufacturing process diagrams of the CMOS solid-state image sensor of the back-illuminated type of the comparative example.
Figure 4:
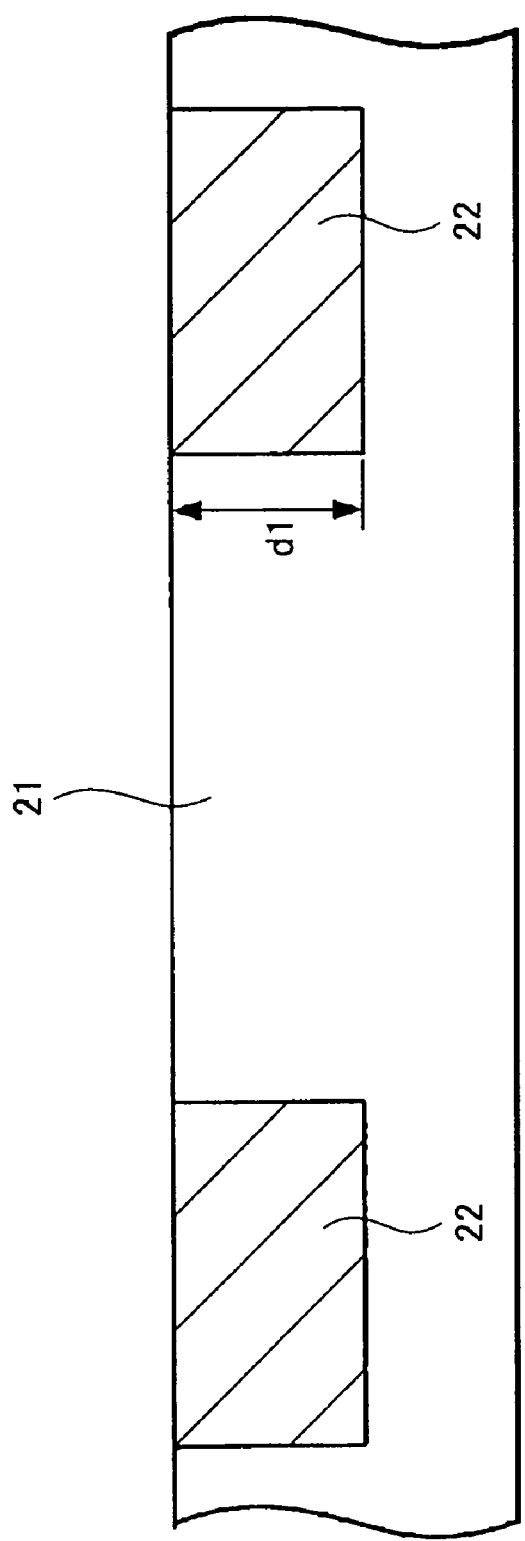
FIG. 4 is a manufacturing process diagram that shows a method for manufacturing a solid-state image sensor according to the first embodiment of the present invention.

In this embodiment, as shown in FIG. 4, first a semiconductor substrate (silicon wafer, for example) 21 is prepared and an element separation area 22 that also serves as an edge detection portion is formed in this semiconductor substrate 21. The element separation area 22 is provided for the pixel separation in order to separate each pixel. The edge detection portion is formed with a material having hardness larger than that of the semiconductor substrate and can be formed with an insulation material such as a silicon oxide film, silicon nitride film or the like, for example. Therefore, the element separation area 22 that also serves as the edge detection portion can be formed by a trench separation area or a LOCOS (selective oxidation) separation area where a silicon oxide film is buried, or the like. In this case, the element separation area 22 having the same level depth d1 as the depth (the depth from the front surface of substrate) of a photodiode PD which becomes a photoelectric conversion element finally made is formed. In other words, the length d1 in the depth direction of the element separation area 22 becomes the length corresponding to the thickness of the photodiode PD.

Figure 5:
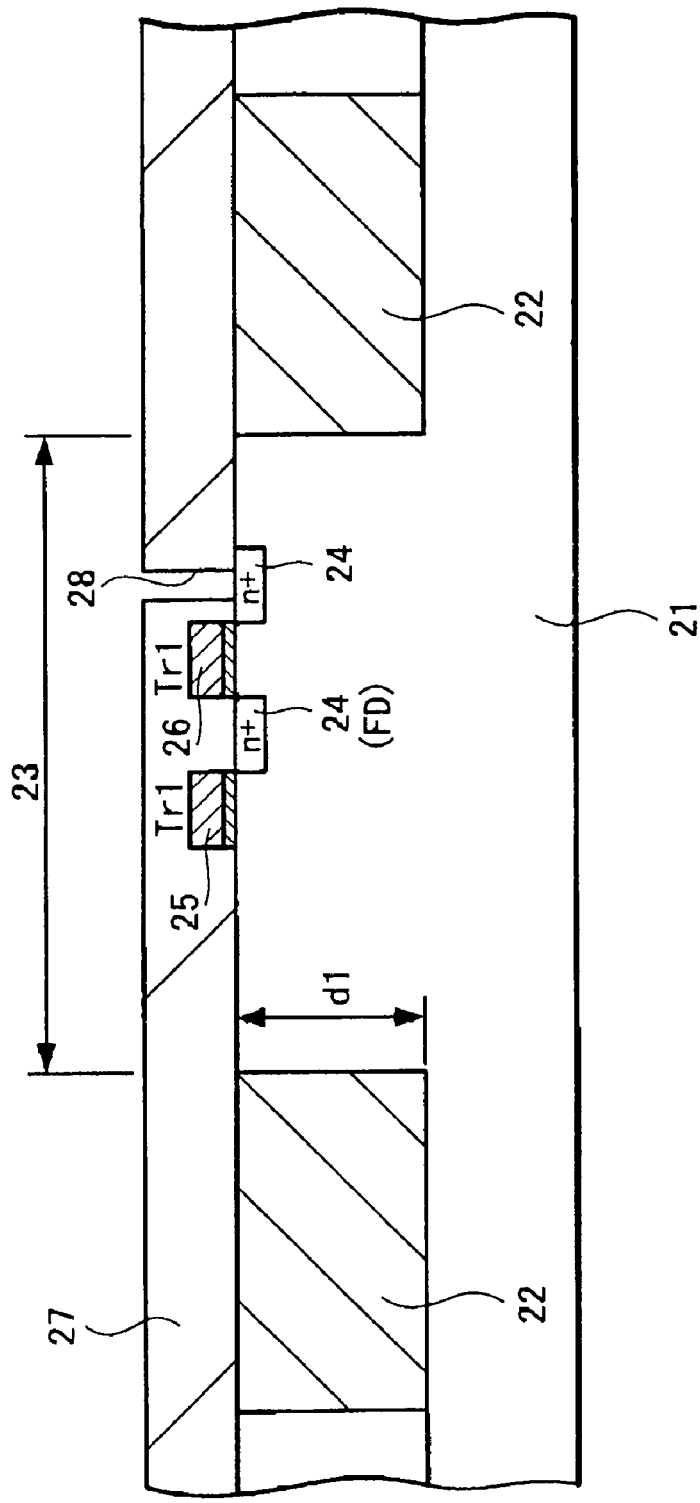
FIG. 5 is a manufacturing process diagram that shows the method for manufacturing the solid-state image sensor according to the first embodiment of the present invention.

Next, as shown in FIG. 5, a plurality of MOS transistors Tr that read out signal electric-charge from a photodiode PD formed later on are formed in each pixel area 23 divided by the element separation area 22 of the semiconductor substrate 21. The plurality of MOS transistors Tr are formed on the front surface side of the substrate.

The plurality of MOS transistors TR are formed of various numbers and, for example, can also be formed of four transistors of an electric-charge readout transistor, a reset transistor, an amplifier transistor and a vertical selection transistor. The electric-charge readout transistor is formed with a photodiode PD, a source-drain area 24 and a gate electrode 25 provided between the both, and the other transistor is made of the other pair of a source-drain area 24 and a gate electrode 26 between the both. After the photodiode PD and the MOS transistor Tr are formed, an interlayer insulation layer 27 is formed, and a contact hole 28 is formed at the position corresponding to the necessary area (for example, source-drain area, gate and the like). The detailed composition of the unit pixel is explained later on.

Figure 6:
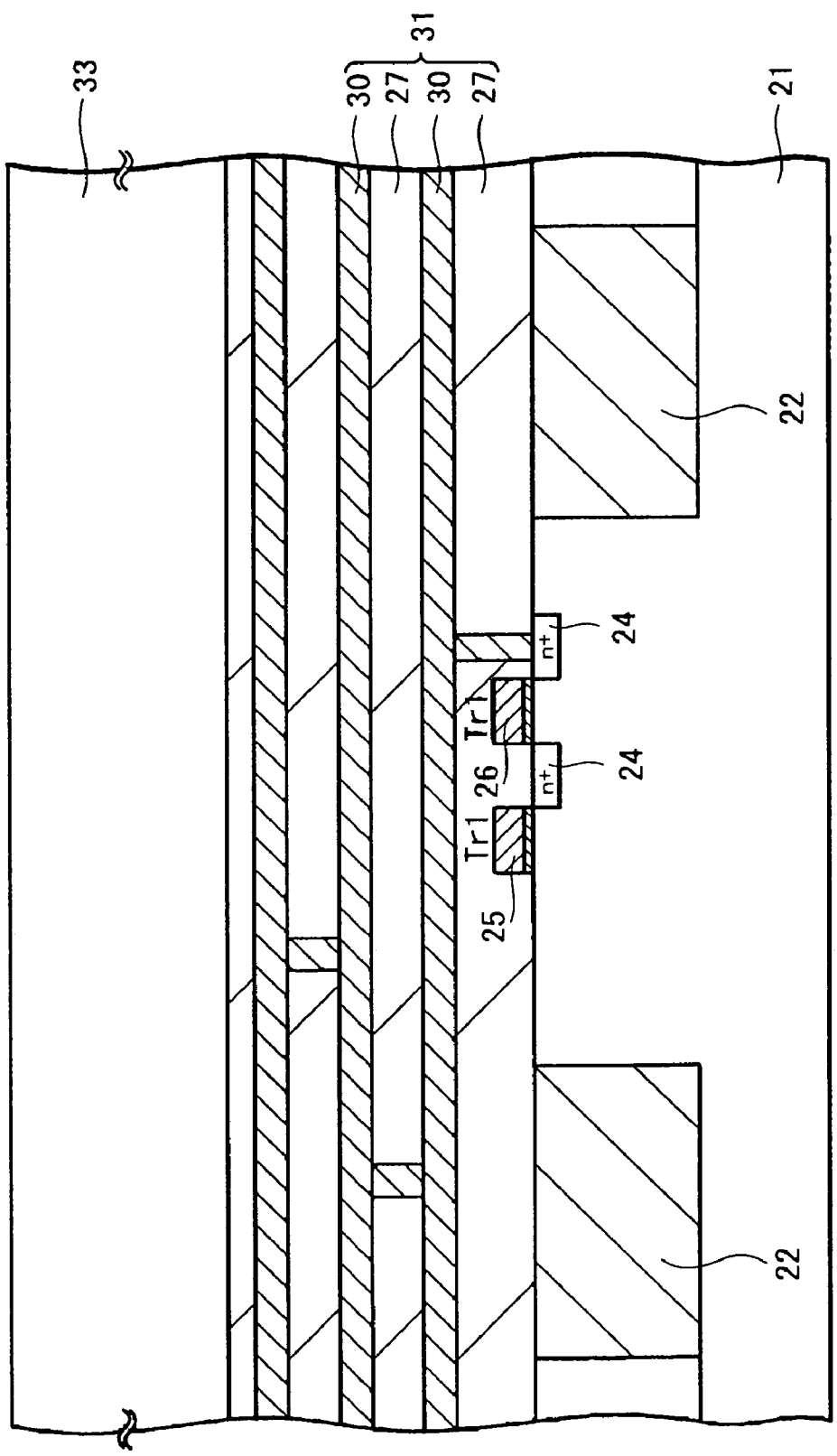
FIG. 6 is a manufacturing process diagram that shows the method for manufacturing the solid-state image sensor according to the first embodiment of the present invention.

Next, as shown in FIG. 6, a multi-layered wiring layer 31 including a multi-layered wiring 30 connected to the relevant area and an interlayer insulation film 27 is formed.

Figure 7:
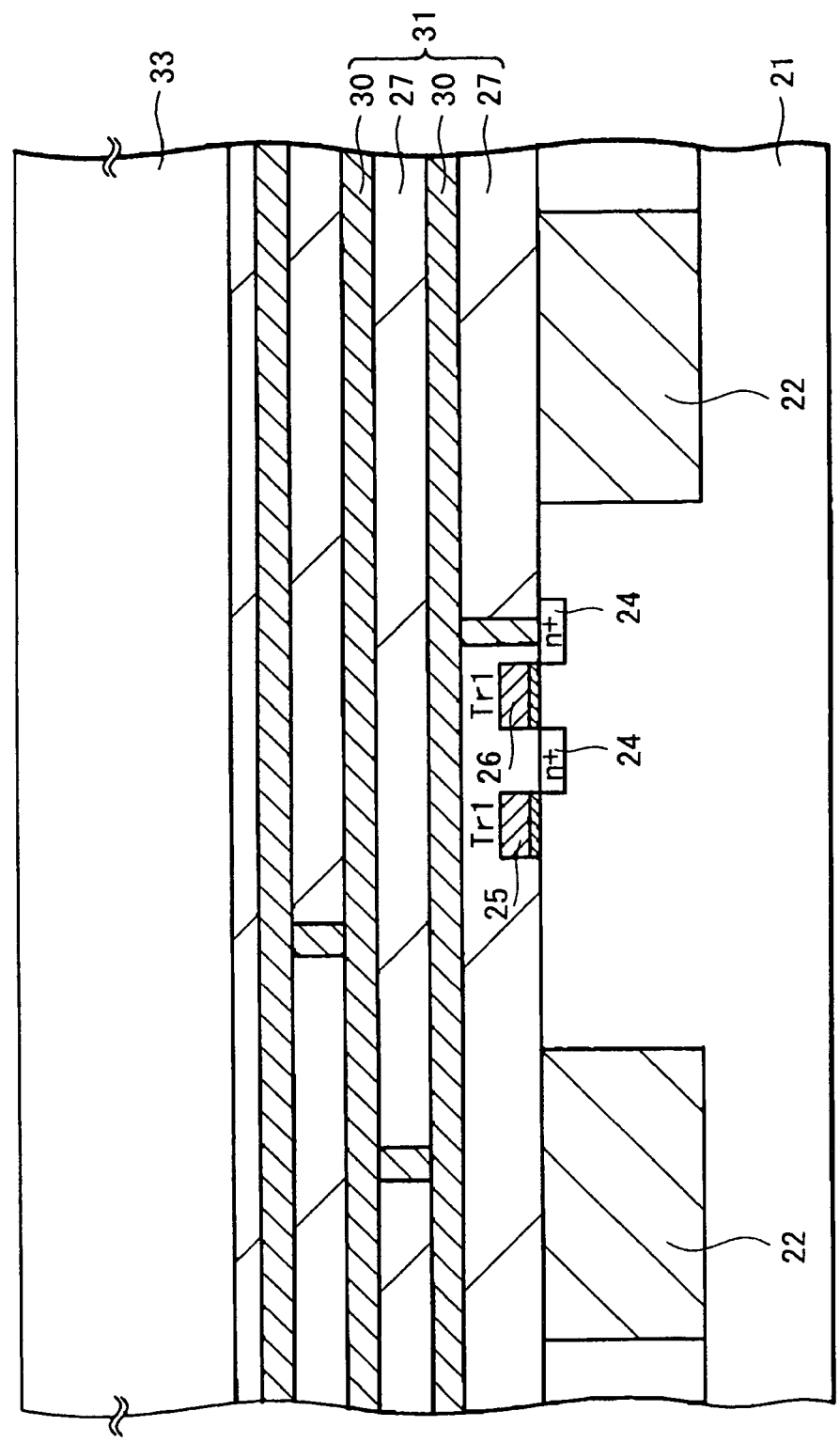
FIG. 7 is a manufacturing process diagram that shows the method for manufacturing the solid-state image sensor according to the first embodiment of the present invention.

Further, as shown in FIG. 7, for example, a support substrate 33 made of a silicon substrate or the like is stuck to the multi-layered wiring layer 31.

Figure 8:
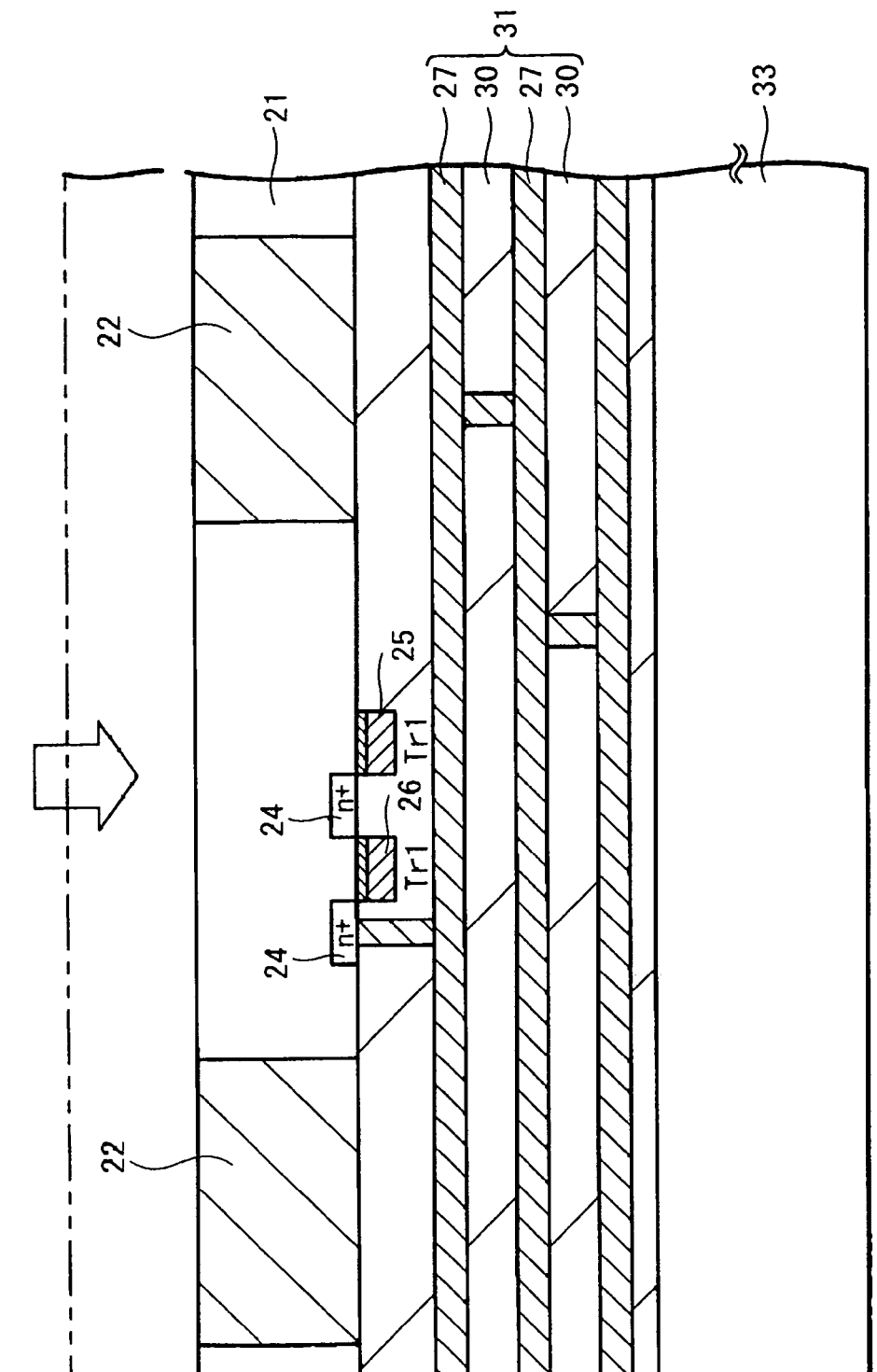
FIG. 8 is a manufacturing process diagram that shows the method for manufacturing the solid-state image sensor according to the first embodiment of the present invention.

Then, as shown in FIG. 8, the semiconductor substrate 21 is reversed and the rear surface side of the semiconductor substrate 21 is removed by means of chemical mechanical polishing (CMP). In this case, the polishing is performed until a position where the bottom of the element separation area 22 also serving as the edge detection portion is exposed. Silicon of the rear surface to be polished and a silicon oxide ($SiO_2$) layer forming the element separation area 22 have difference in hardness when polished respectively by the CMP, and the silicon oxide layer has the larger hardness. Because of the difference in hardness, the silicon oxide layer of the element separation area 22 appeared on the surface by rear surface polishing acts as a stopper, and the silicon substrate 22 is not polished any more and the silicon polished surface appears in a self-aligning manner. In other words, the end of polishing is detected in the self-aligning manner by the bottom of the element separation area 22. The polishing by the CMP is stopped at the position where the bottom of this element separation area 22 appeared.

Figure 9:
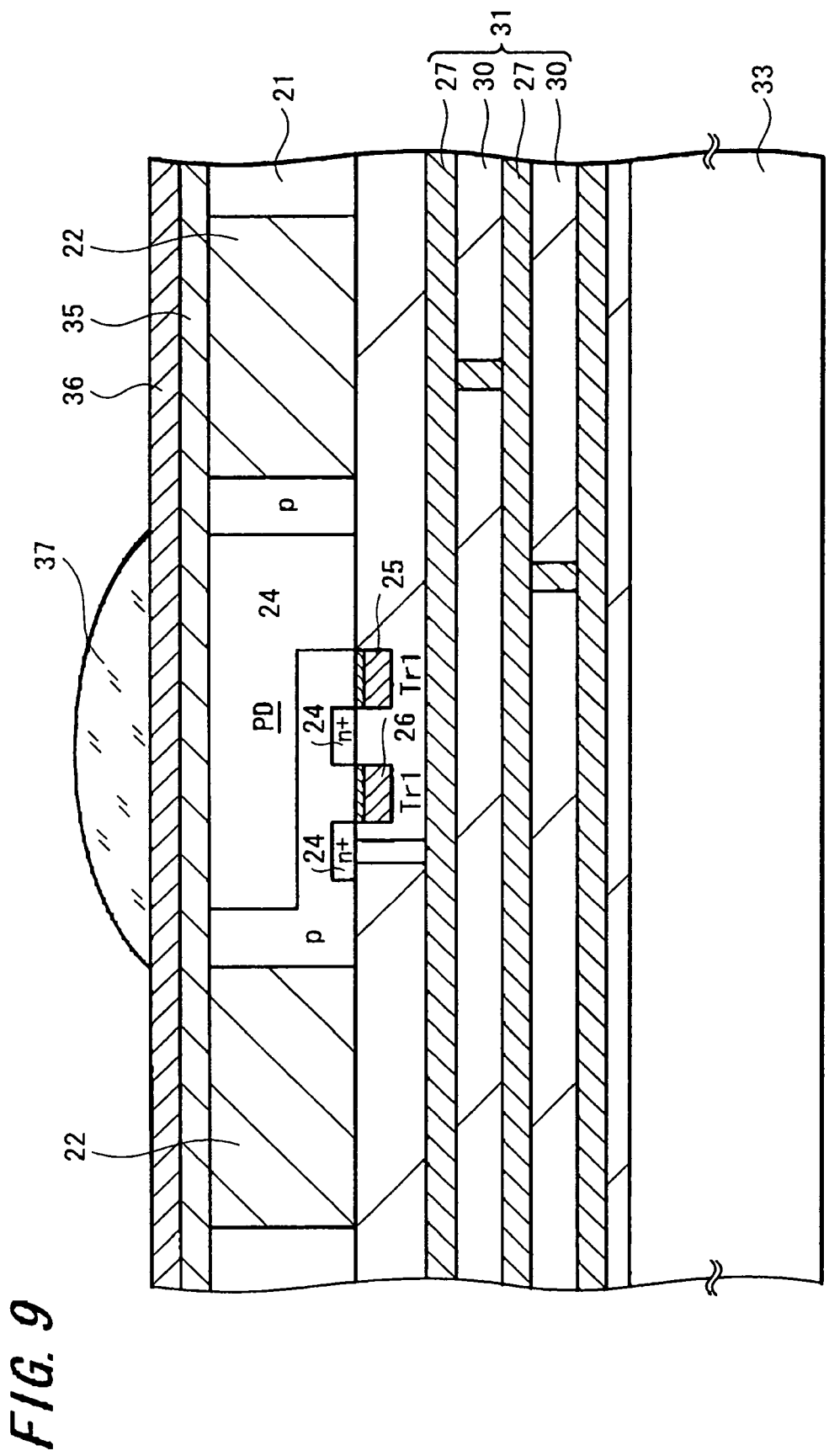
FIG. 9 is a manufacturing process diagram that shows the method for manufacturing the solid-state image sensor according to the first embodiment of the present invention.

Further, as shown in FIG. 9, a photodiode PD is formed in the semiconductor substrate 21 by ion implantation from the rear surface of the substrate. The photodiode PD is formed in the same depth as the depth d1 of the element separation area 22. Note that the photodiode PD can also be formed by the ion implantation from the front surface side of the substrate at the process of FIG. 11B. Furthermore, a protective insulation film 35 is formed on the front surface of the substrate, and a color filter 36 and an on-chip lens 37 are formed thereon, and an objective CMOS solid-state image sensor 38 is obtained.

Note that, the edge detection portion can be formed on the element separation area, a scribe line or the like.

Figure 10:
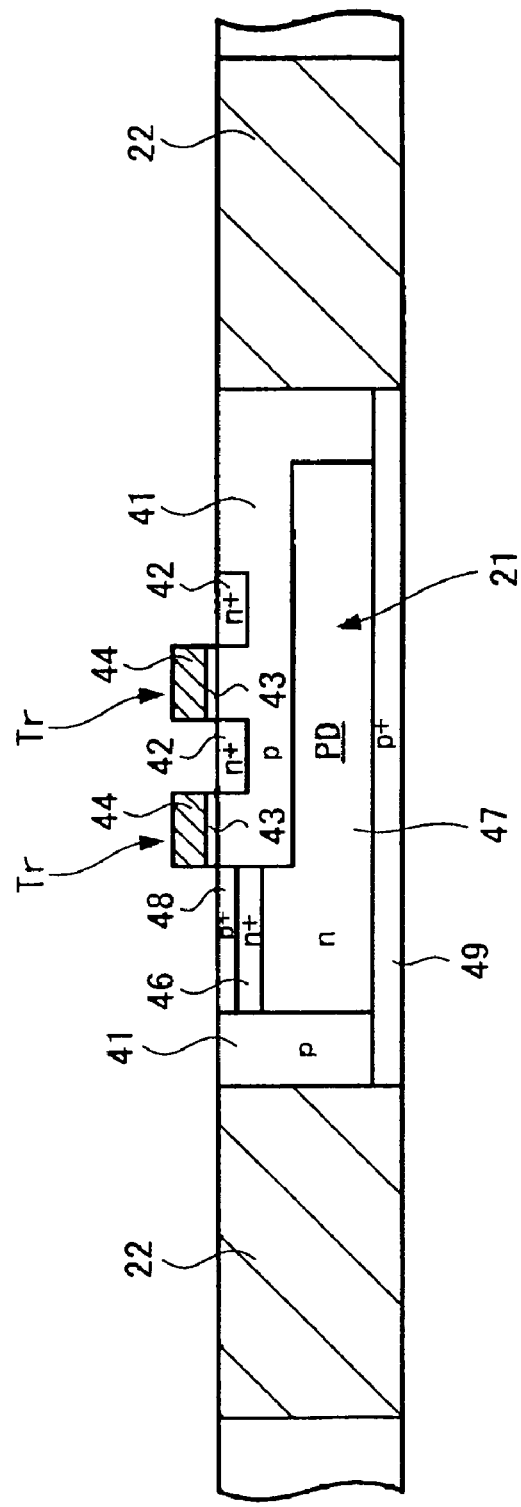
FIG. 10 is a cross sectional diagram that shows an example of the unit pixel of the CMOS solid-state image sensor of the back-illuminated type.

FIG. 10 shows an example of a unit pixel made of a photodiode PD and a plurality of MOS transistors Tr. This unit pixel is formed including: a plurality of MOS transistors Tr each made of an $n^+$ source-drain area 42, gate insulation film 43 and gate electrode 44 are formed, for example, in a p-type semiconductor well area 41 surrounded by the element separation area 22 of the n-type semiconductor substrate 21, and the photodiode PD formed to reach to the front surface from the rear surface of the substrate and to extend below the P-type semiconductor well area 41 where MOS transistors Tr are formed. The photodiode PD is formed of an $n^+$ electric-charge accumulation area 46, n-type semiconductor area 47 and the $p^+$ semiconductor areas 48, 49 to be the accumulation layers formed on both the front and rear surfaces for controlling a dark current.

Figure 11A:
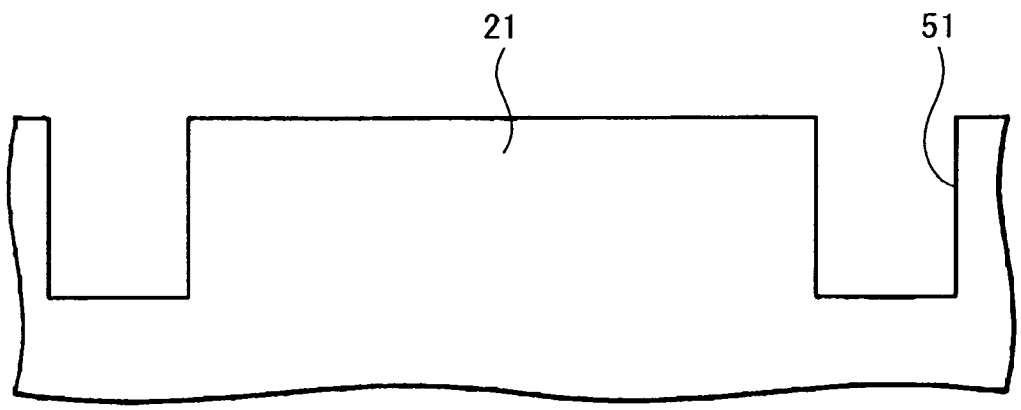
FIGS. 11A to 11C are manufacturing process diagrams that show an example of an edge detection portion made of a pillar layer according to an embodiment of the present invention.
Figure 11B:
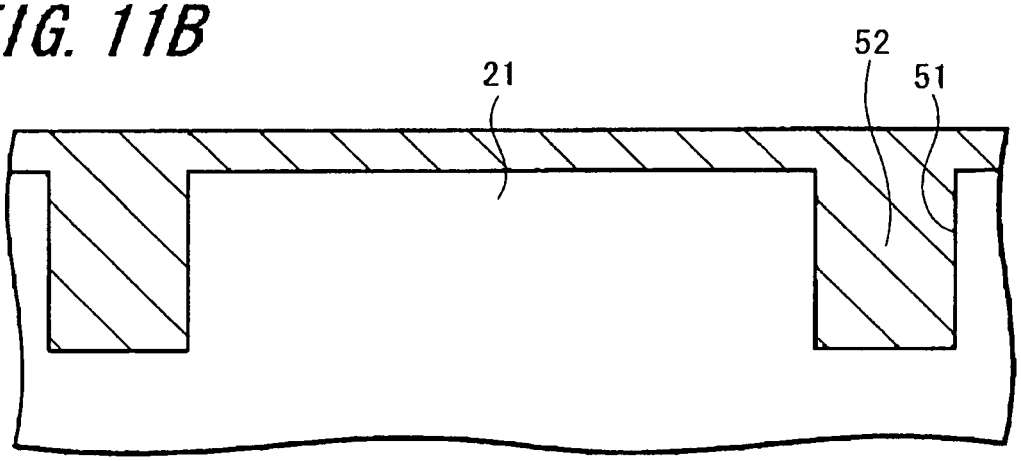
Figure 11C:
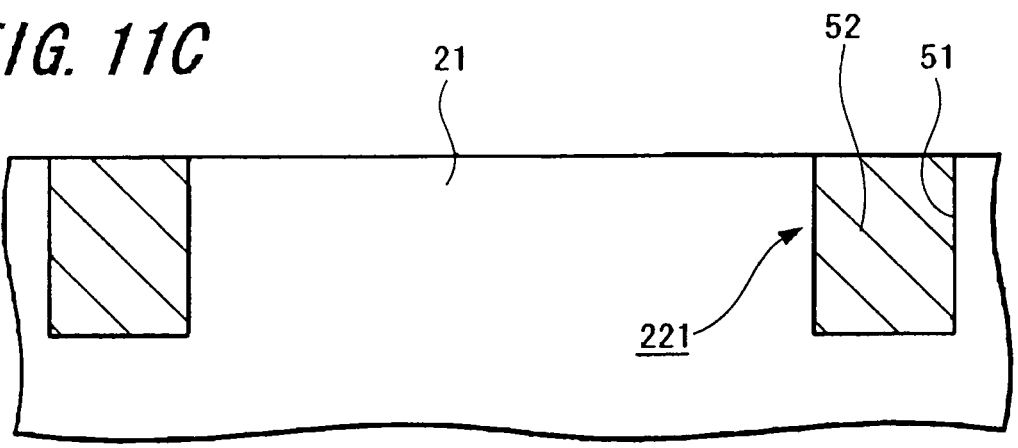

An example of the case in which the element separation area 22 to be the edge detection portion is formed with a trench separation area is shown in FIGS. 11A to 11C. After a trench 51 is formed in the silicon substrate 21 (FIG. 11A), a silicon oxide film 52, for example, formed by CVD (Chemical Vapor Deposition) to bury the trench 51 is formed (FIG. 11B), and then, the silicon oxide film 52 is etched back to make the silicon oxide film 52 remain only in the trench 51. In this way, a trench separation area 221 is formed.

Figure 12A:
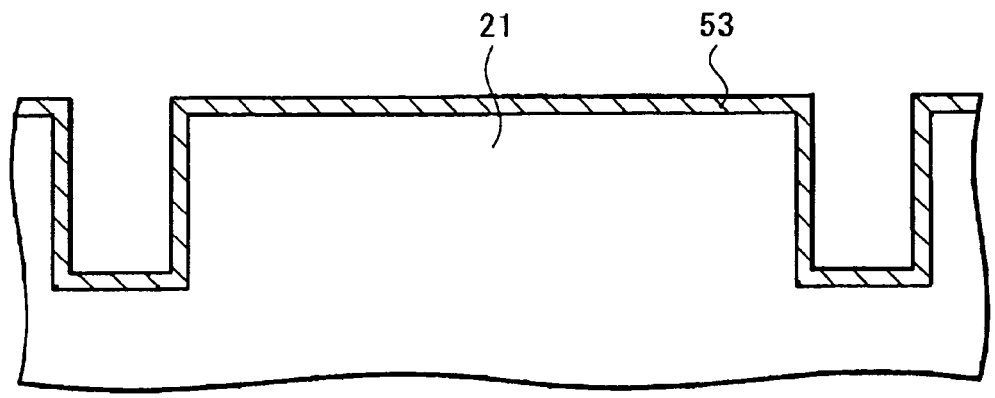
FIGS. 12A and 12B are manufacturing process diagrams that show another example of the edge detection portion made of the pillar layer according to an embodiment of the present invention.
Figure 12B:
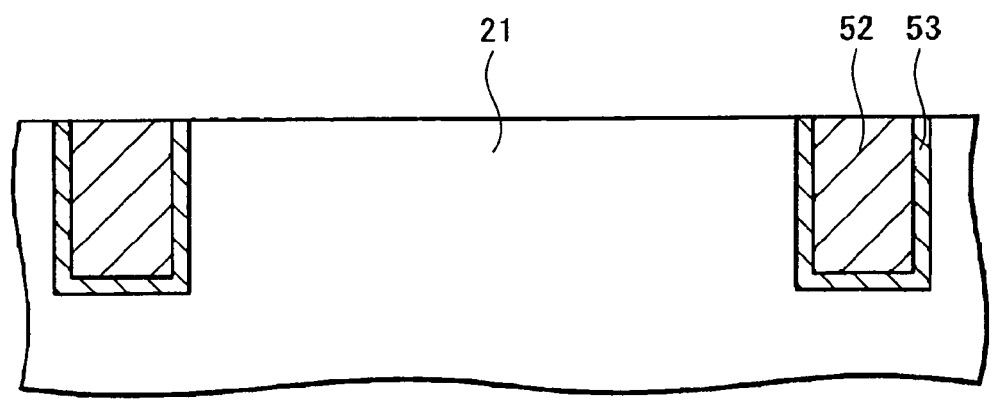

Another example of the case in which the element separation area 22 to be the edge detection portion is formed with a trench separation area is shown in FIGS. 12A and 12B. After the trench 51 is formed in the silicon substrate 21, a silicon nitride film 53, for example, is formed by the CVD to cover the inner surface of the trench and the front surface of the substrate (refer to FIG. 12A), and then, the silicon oxide film 52 is formed by the CVD, for example, to bury the trench 51, and after that, the silicon oxide film 52 and the silicon nitride film 53 are etched back to make the silicon nitride film 53 and the silicon oxide film 52 remain only in the trench 51 (refer to FIG. 12B). In this way, a trench separation area 222 where the silicon nitride film 53 is formed at the bottom of the trench 51 is formed. This trench separation area 222 is more suitable as the edge detection portion, because the silicon nitride film 53 has hardness larger than that of the silicon oxide film 52.

In the case in which the element separation area 22 to be the edge detection portion is formed with a LOCOS separation area, though it is not shown, after a silicon nitride film typically patterned on the silicon substrate or a two-layer film structure of the silicon nitride film and poly-silicon film is formed, oxidation treatment is performed to form a silicon oxide ($SiO_2$) layer on the surface of the substrate where the silicon nitride film is not formed, and after that, the silicon nitride film is removed and the LOCOS separation area made of the silicon oxide film is formed.

According to the above-described first embodiment of the CMOS solid-state image sensor 38 of the back-illuminated type, since without using the SOI substrate and with using the silicon substrate which is made to be a thin film by means of the element separation area also serving as the edge detection portion made in the silicon substrate 21 and on which each component of the solid-state image sensor is formed, the solid-state image sensor of the back-illuminated type can be provided at low cost with high accuracy.

According to the first embodiment of the manufacturing method, since the SOI substrate is not necessary and the manufacturing process is simplified, the manufacturing cost can be reduced greatly. General-purpose CMOS process technology can be used without any change.

Since the edge detection portion is formed with the element separation area, what is called a surface unevenness in which the film thickness of the semiconductor substrate is locally uneven can be prevented and the whole of the semiconductor substrate can be made to become a thin film having the even thickness, when the semiconductor substrate 21 is made to be the thin film by the chemical mechanical polishing. Since the chemical mechanical polishing is used, the semiconductor substrate can easily be made to be a thin film, in which, for example, the time for thin film treatment can be shortened.

FIGS. 13 through 16 show the second embodiment in which a solid-state image sensor according to the present invention is applied to a CMOS solid-state image sensor of the back-illuminated type. Here, the CMOS solid-state image sensor of the back-illuminated type is also explained as well as a method for manufacturing thereof.

Figure 13:
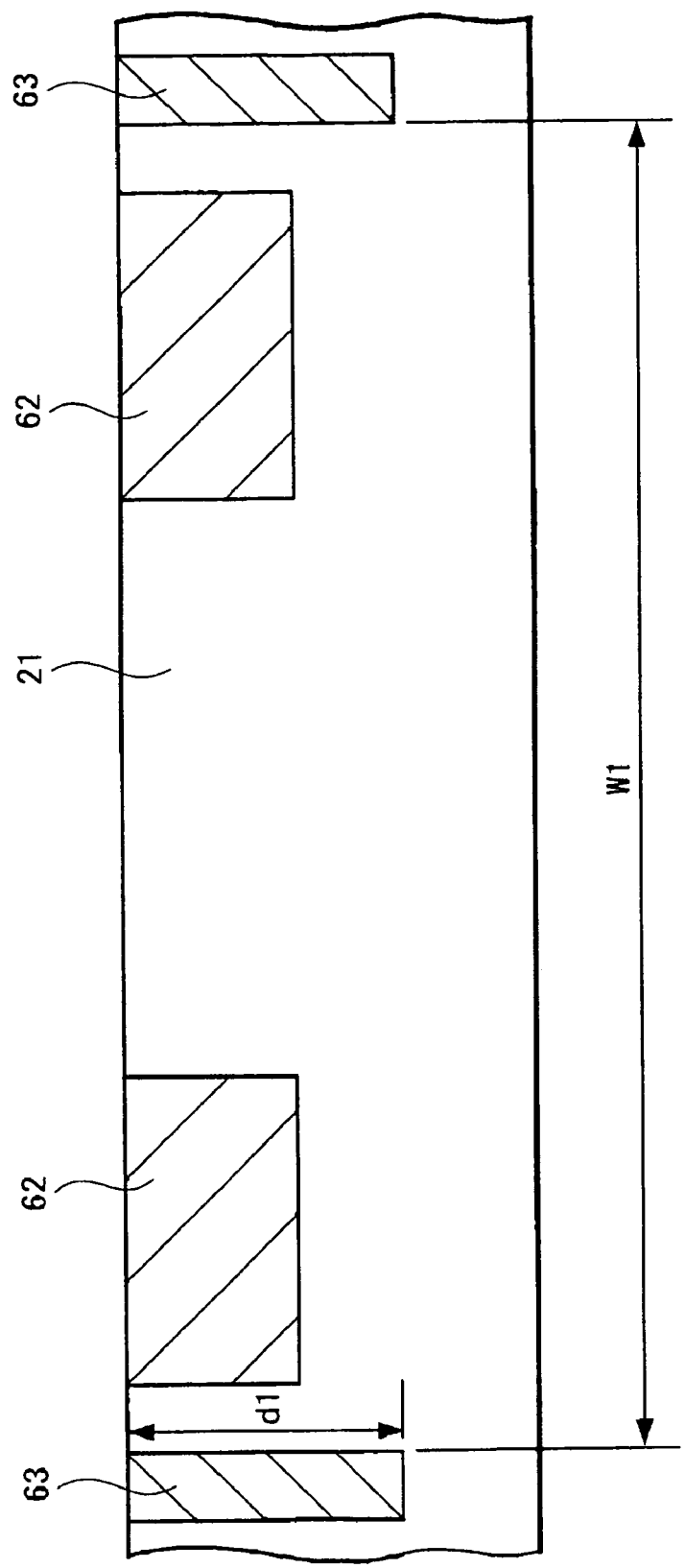
FIG. 13 is a manufacturing process diagram that shows the method for manufacturing the solid-state image sensor according to the second embodiment of the present invention.

In this embodiment, as shown in FIG. 13, first a semiconductor substrate (silicon wafer, for example) 21 is prepared and an element separation area 62 that separates pixels is formed in this semiconductor substrate 21. Further, an edge detection portion 63 made of a pillar layer is formed extending from the front surface of the substrate to the requiring depth in this semiconductor substrate 21. The element separation area 62 can be formed with a trench separation area buried with the silicon oxide film, a LOCOS (selective oxidation) separation area or the like, similarly to the above-described embodiment. The edge detection portion 63 is formed with more depth than the element separation area 62 and is formed with the material having hardness larger than that of the semiconductor substrate 21 similarly to the above-described embodiment. The edge detection portion 63 can be formed with the silicon oxide film or silicon nitride film, for example. The edge detection portion 63 is formed with the same depth d1 as the depth (the depth from the front surface of substrate) of a photodiode PD which becomes a photoelectric conversion element finally formed. Specifically, the length d1 in the depth direction of the edge detection portion 63 becomes the length corresponding to the thickness of the photodiode PD.

A plurality of the edge detection portion 63 are formed in the semiconductor substrate 21, and an interval w1 between adjacent edge detection portions 63 is set to the interval which prevents the uneven thickness from locally occurring in the rear surface polishing by means of the CMP method described later on. Although the edge detection portion 63 can be formed anywhere in the semiconductor substrate 21, it is desirable to be formed within the area that becomes the solid image chip in order not to cause the uneven thickness in each solid image chip. In order to understand the explanation, though the edge detection portion 63 is formed on the outside of the element separation area 62 to divide unit pixels in the case shown in the drawing, the edge detection portion 63 may be formed where no uneven thickness occurs at the time of rear surface polishing. When the miniaturization of the pixel and the high density integration are considered, it is desirable to provide the edge detection portion 63 outside the image area (on the outside where the pixel is not affected) in the case of the solid-state image sensor where the image area (pixel area), peripheral circuit portion, and the like are formed.

The edge detection portion 63 made of the pillar layer can be formed such that a trench is formed in the semiconductor substrate 21 and the trench is buried with the silicon oxide film (refer to FIG. 11), or with the silicon nitride film, or with the silicon nitride film and silicon oxide film similarly to that explained in FIG. 12.

Figure 14:
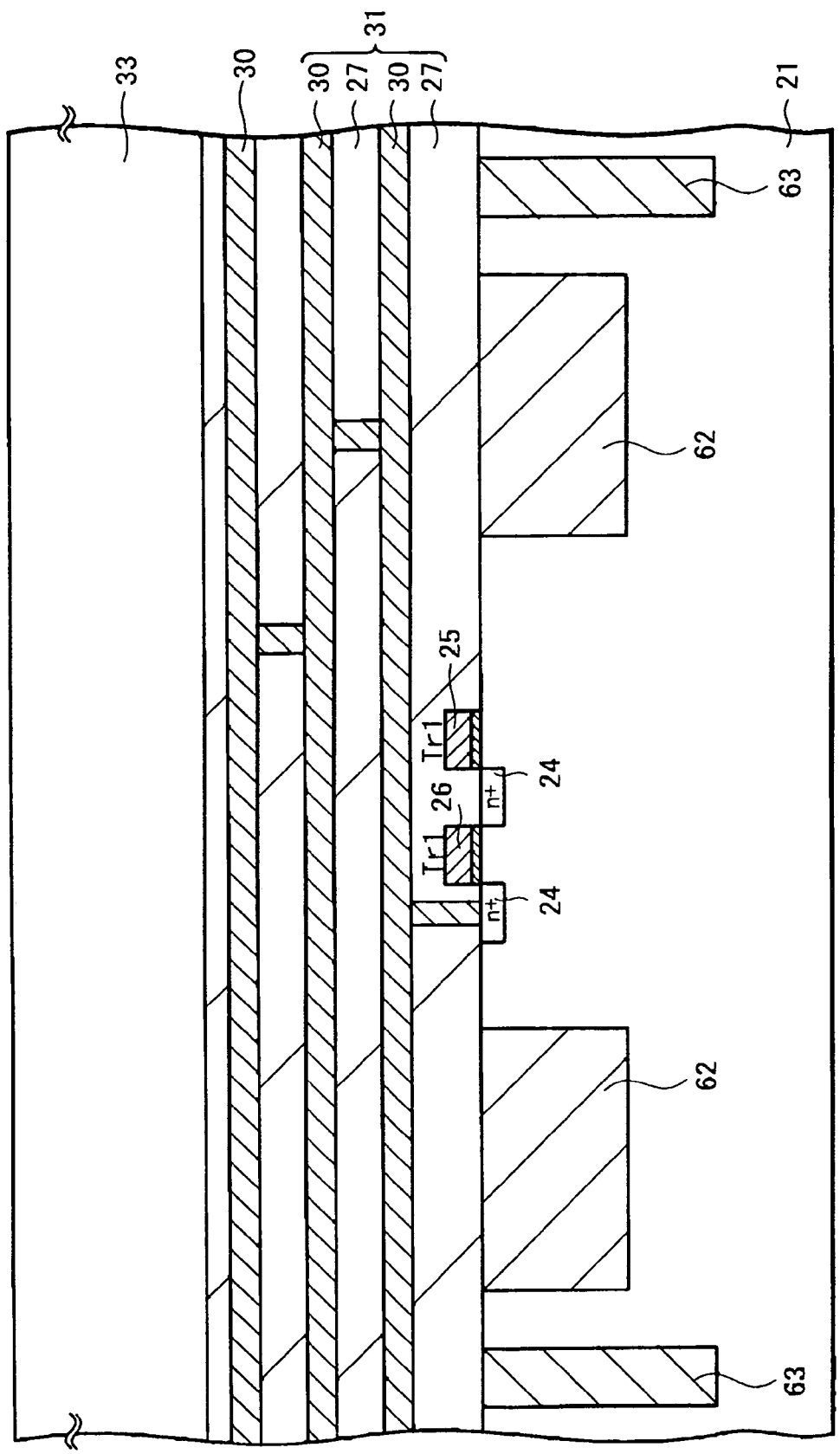
FIG. 14 is a manufacturing process diagram that shows the method for manufacturing the solid-state image sensor according to the second embodiment of the present invention.

Next, as shown in FIG. 14, similarly to the above-described embodiment, a plurality of MOS transistors Tr, for example, four transistors of an electric-charge readout transistor, a reset transistor, an amplifier transistor and a vertical selection transistor are formed on the front surface side of the substrate of each unit pixel area divided by the element separation area 62 of the semiconductor substrate 21. Further, after the multi-layered wiring layer 31 including the interlayer insulation film 27 and the multi-layered wiring 30 is formed, the support substrate 33 made of a silicon substrate or the like, for example, is stuck to the multi-layered wiring layer 31.

Figure 15:
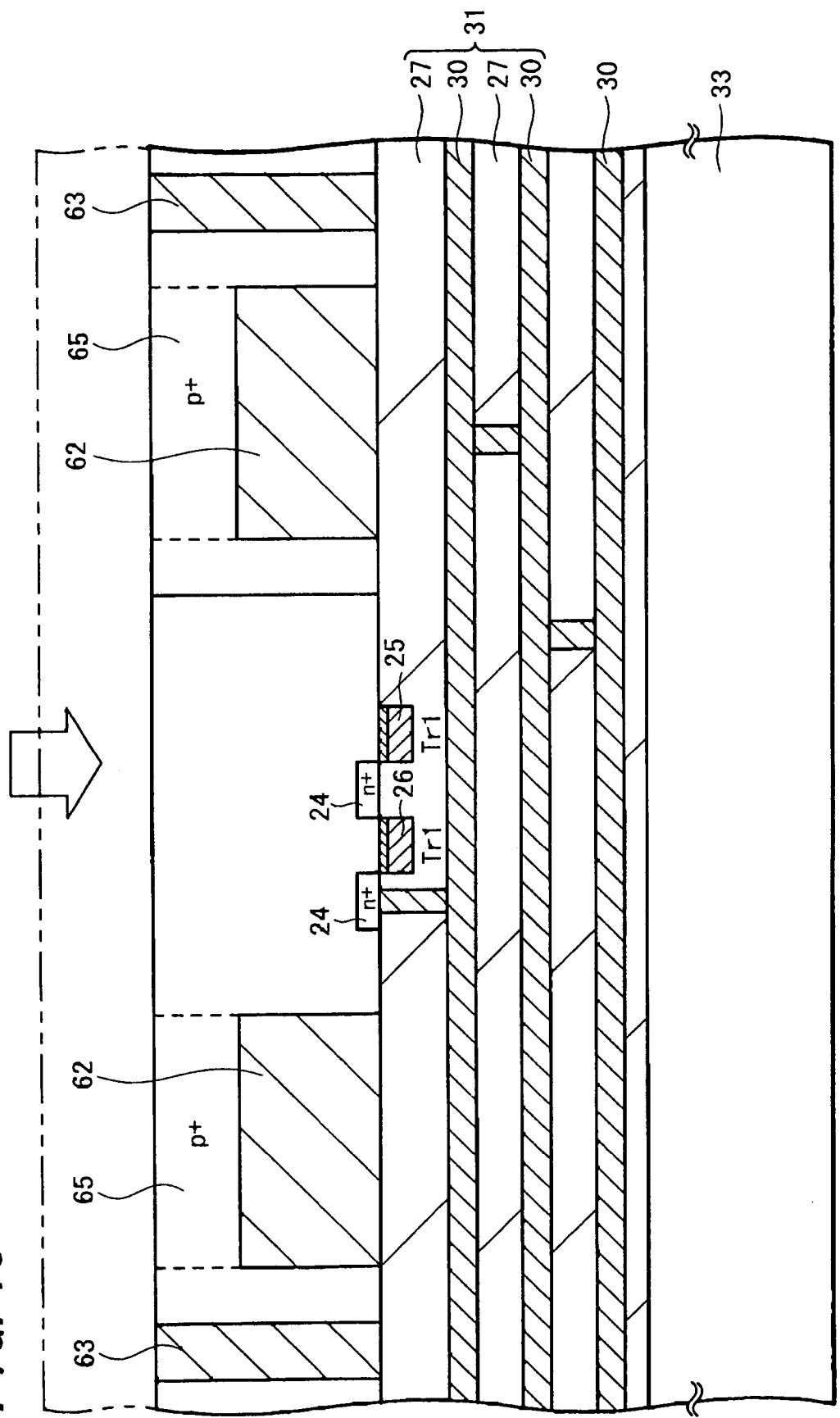
FIG. 15 is a manufacturing process diagram that shows the method for manufacturing the solid-state image sensor according to the second embodiment of the present invention.

Then, as shown in FIG. 15, the semiconductor substrate 21 is reversed and the rear surface side of the semiconductor substrate 21 is removed by the CMP method. In this case, polishing is performed until the position where the bottom of the edge detection portion 63 is exposed and the end of the polishing is detected by means of the difference between the hardness of the edge detection portion 63 and the hardness of the semiconductor substrate 21 when the edge detection portion was exposed, and the polishing is stopped.

Figure 16:
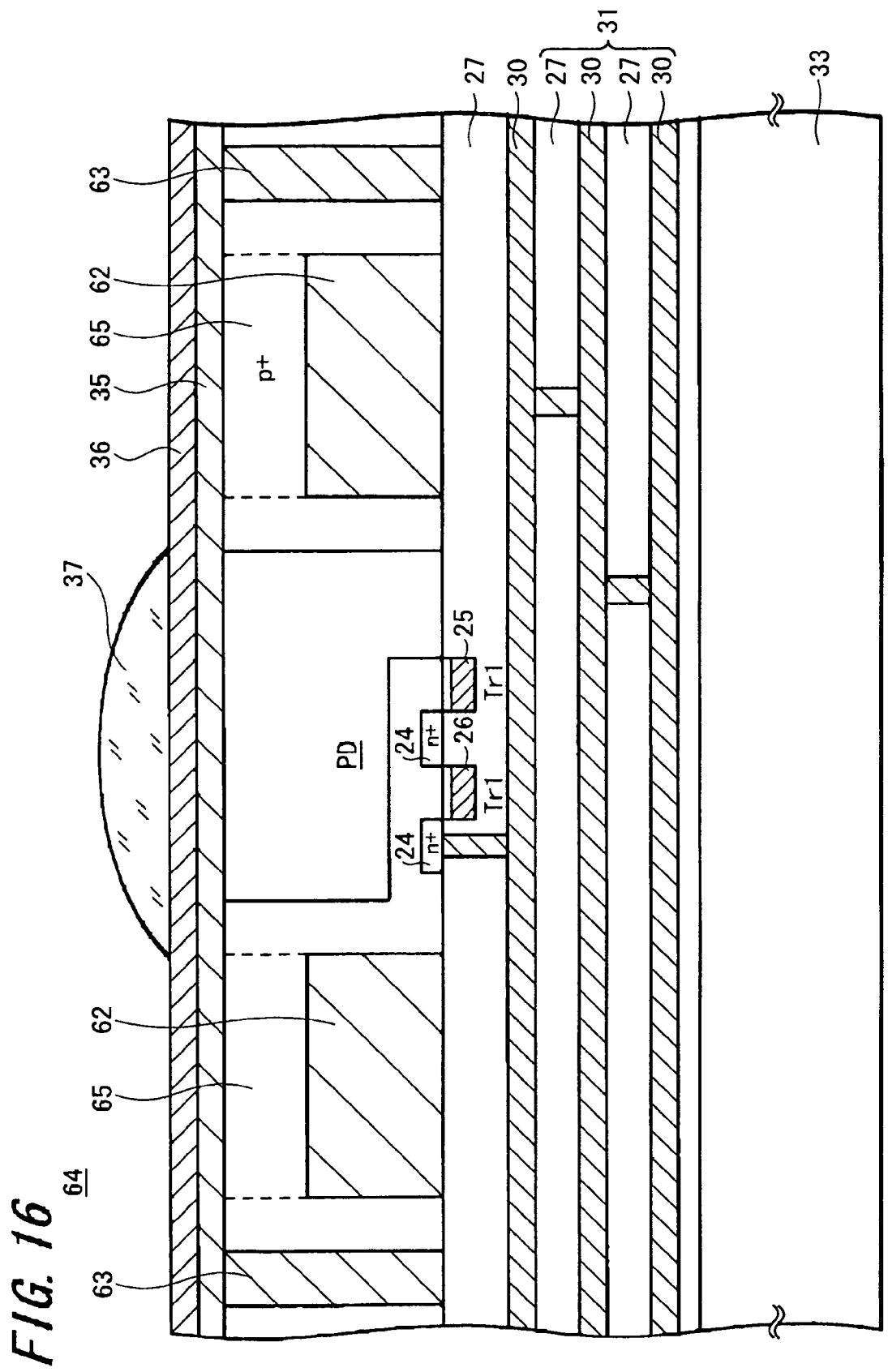
FIG. 16 is a manufacturing process diagram that shows the method for manufacturing the solid-state image sensor according to the second embodiment of the present invention.

Further, as shown in FIG. 16, a photodiode PD is formed in the semiconductor 21 by ion implantation from the rear surface of the substrate. The photodiode PD is formed with the same depth as the depth d1 of the element separation area 62. The photodiode can also be formed by the ion implantation from the rear surface of the substrate at the process shown in FIG. 14. A semiconductor element separation area 65 can be formed below the element separation area 62 made of an insulative material. Further, the protective insulation film 35 is formed on the surface of the substrate, and the color filter 36 and on-chip lens 37 are formed thereon, and an objective CMOS solid-state image sensor 64 of the back-illuminated type is obtained. The composition of the unit pixel of this embodiment is the same as the above described composition of FIG. 10.

According to the above-described second embodiment, since a plurality of the edge polishing portions 63 made of the pillar layer which serve as the polishing stoppers in the chemical mechanical polishing (CMP) are appropriately arranged and formed separately from the element separation area 62, CMP can be controlled without causing the uneven thickness even if the silicon substrate 21 is removed excessively in the CMP. Further, similar effectiveness to the first embodiment described above is obtained.

Figure 17:
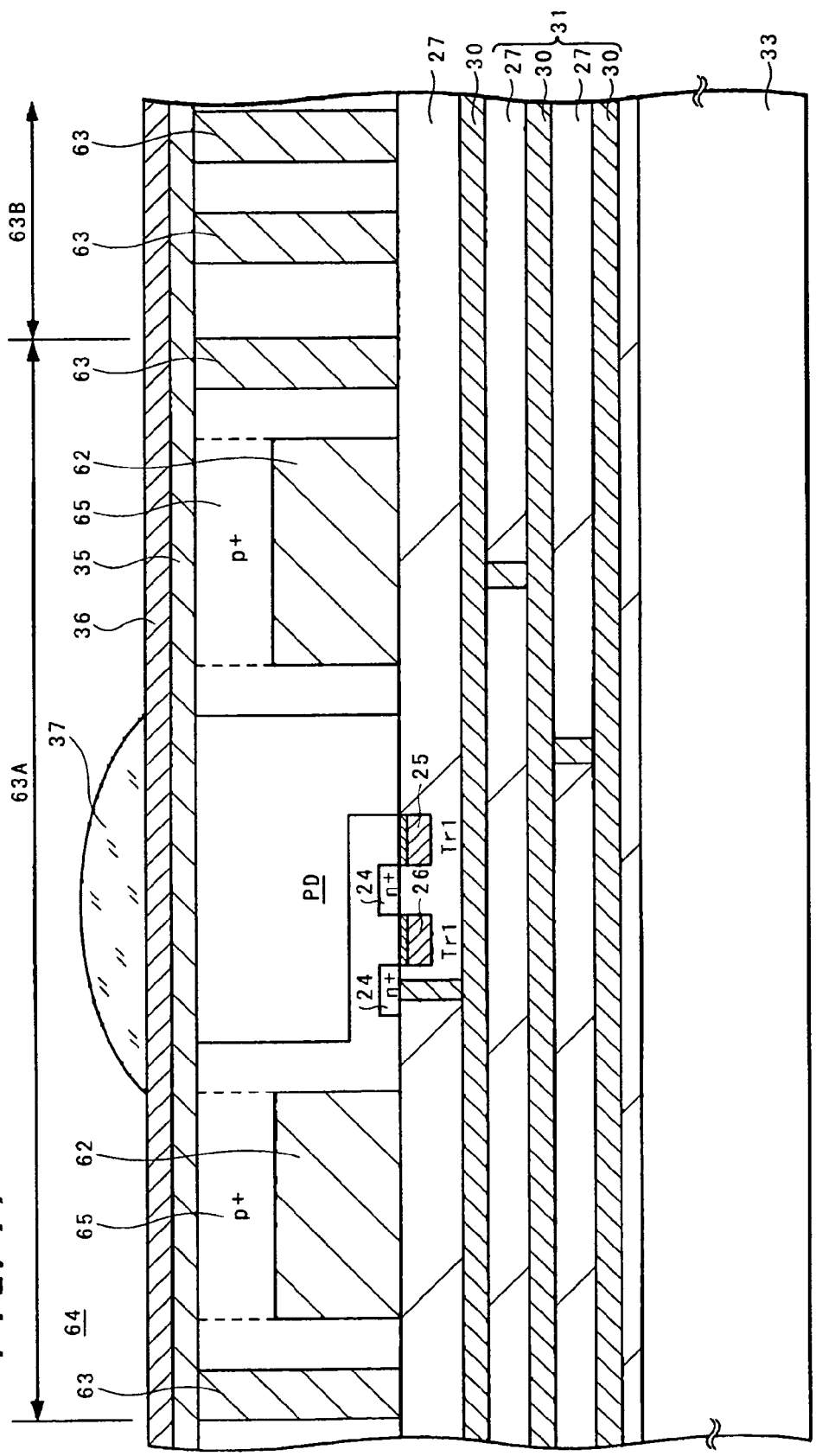
FIG. 17 is a constitutional diagram that shows a relevant portion of the solid-state image sensor according to the third embodiment of the present invention.

FIG. 17 shows the third embodiment of the CMOS solid-state image sensor of the back-illuminated type according to the present invention. In this embodiment, further the edge detection portions 63 of FIG. 16 described above partly constitute an area 63B where the edge detection portions 63 are formed in a concentrated manner. Specifically, as the edge detection portion 63 made of the pillar layer, a sparse area 63A where the edge detection portions 63 are not densely formed is evenly formed, and in that state, the concentrated area 63B where the edge detection portions 63 are densely formed is partly formed. Since the other structure than the above is the same as FIG. 16, the same numerals are given to the corresponding portions and redundant explanations thereof are omitted.

According to the above third embodiment, since the concentrated area 63B of the edge detection portions 63 is formed, the accuracy of the CMP can be increased. In other words, it becomes possible to make the semiconductor substrate 21 be the thin film by the CMP with the more even film thickness. Further, the same effectiveness as the second embodiment is obtained.

Figure 18:
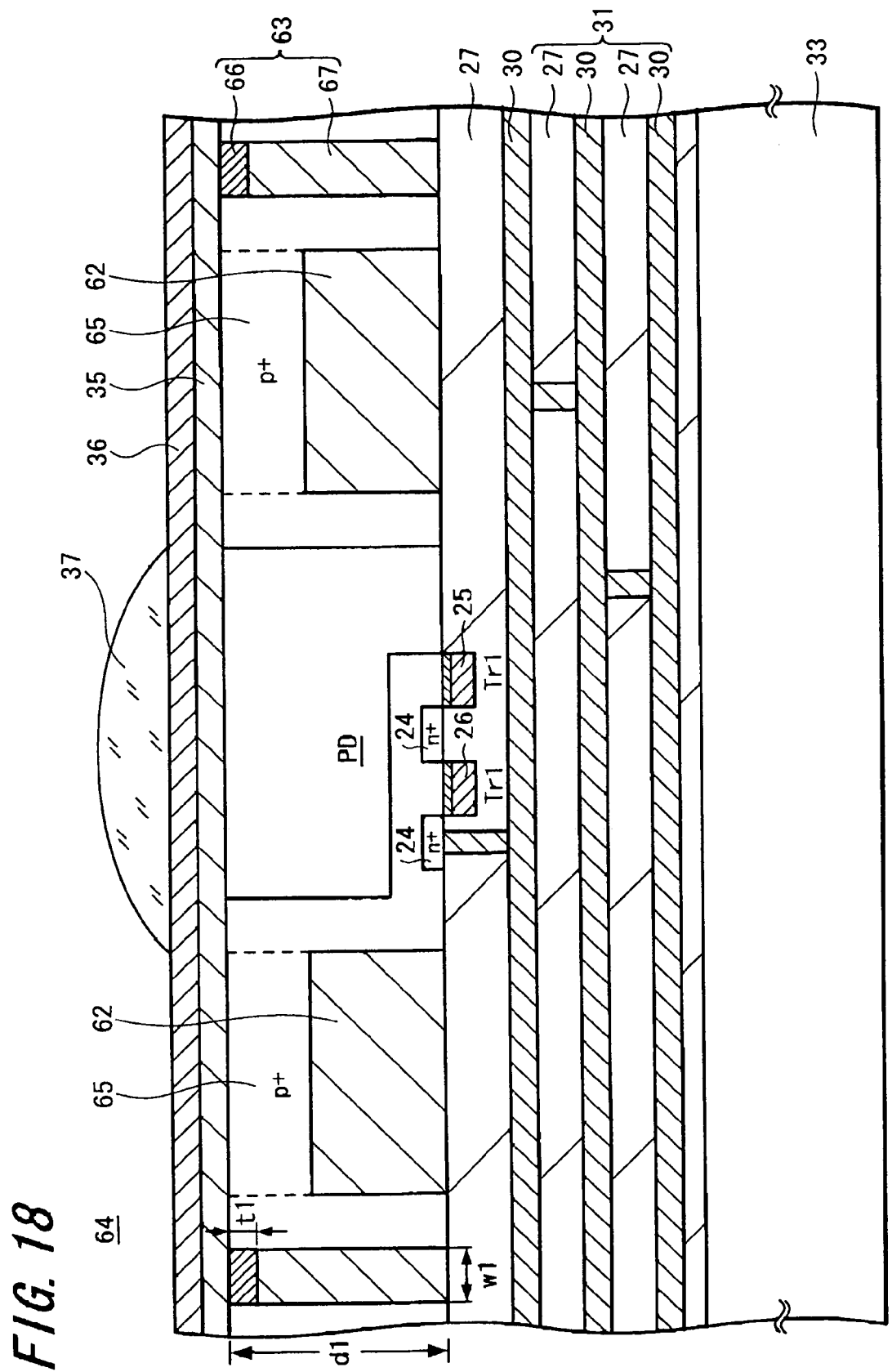
FIG. 18 is a constitutional diagram that shows a relevant portion of the solid-state image sensor according to the fourth embodiment of the present invention.

FIG. 18 shows the fourth embodiment of the CMOS solid-state image sensor of the back-illuminated type according to the present invention. In this embodiment, the edge detection portion 63 made of the pillar layer of FIG. 16 as described above includes a material film 66 such as a silicon nitride film (SiN film) with high selectivity (having a large hardness) for the silicon substrate 21, which is particularly formed at the bottom of the pillar layer, namely, at the bottom exposed to the rear surface of the substrate. As the material film 66, other than the SiN film, for example, the film made of, for example, poly-silicon, tungsten (W), SiW, Ti, TiSi, TiN, NSi, CoSi and other metal silicide can be used. The film thickness t1 of the material film 66 can be set in the range of one tenth to one twentieth the depth d1 of the edge detection portion 63 (t1=d1/10 to d1/20).

For example, the edge detection portion 63 can be formed with a silicon oxide film 67 and silicon nitride film 66. In this case, after the trench is formed, the silicon nitride film 66 is formed on the entire surface of the substrate including the inner wall of the trench, the silicon oxide film 67 is formed on the entire surface to bury the trench, the whole of the silicon nitride film 66 and silicon oxide film 67 are etched back to the surface of the substrate, and consequently the edge detection portion 63 can be formed. Since the other structure is the same as the first embodiment described above, the same numerals are given to the corresponding portions and the redundant explanations thereof are omitted.

According to the above forth embodiment, since the material film 66 having larger hardness is formed at the bottom of the edge detection portion 63, the stopper function of the edge detection portion 63 can further be enhanced. Furthermore, the same effectiveness as the second embodiment can be obtained.

Furthermore, the width w1 of the edge detection portion 63 can be set to the width larger than the minimum line width of the solid-state image sensor. The distance of light incident on the semiconductor substrate in the back-illuminated type is, for example, about 0.5 µm in the case of blue light, about 3.0 µm in the case of green light, about 5.0 µm in the case of red light and about 10 µm in the case of infrared light. Therefore, in a color solid-state image sensor of red, green and blue, the length d1 in the depth direction of the edge detection portions 22, 63 can be set to about 5.0 µm. Further, the length d1 in the depth direction of the edge detection portions 22, 63 can be set to about 10 µm, when infrared light is required.

In the above-described embodiments, the present invention is applied to the CMOS solid-state image sensor of the back-illuminated type, however, can also be applied to the other solid-state image sensors, for example, to a CCD solid-state image sensor of the back-illuminated type.

Figure 19:
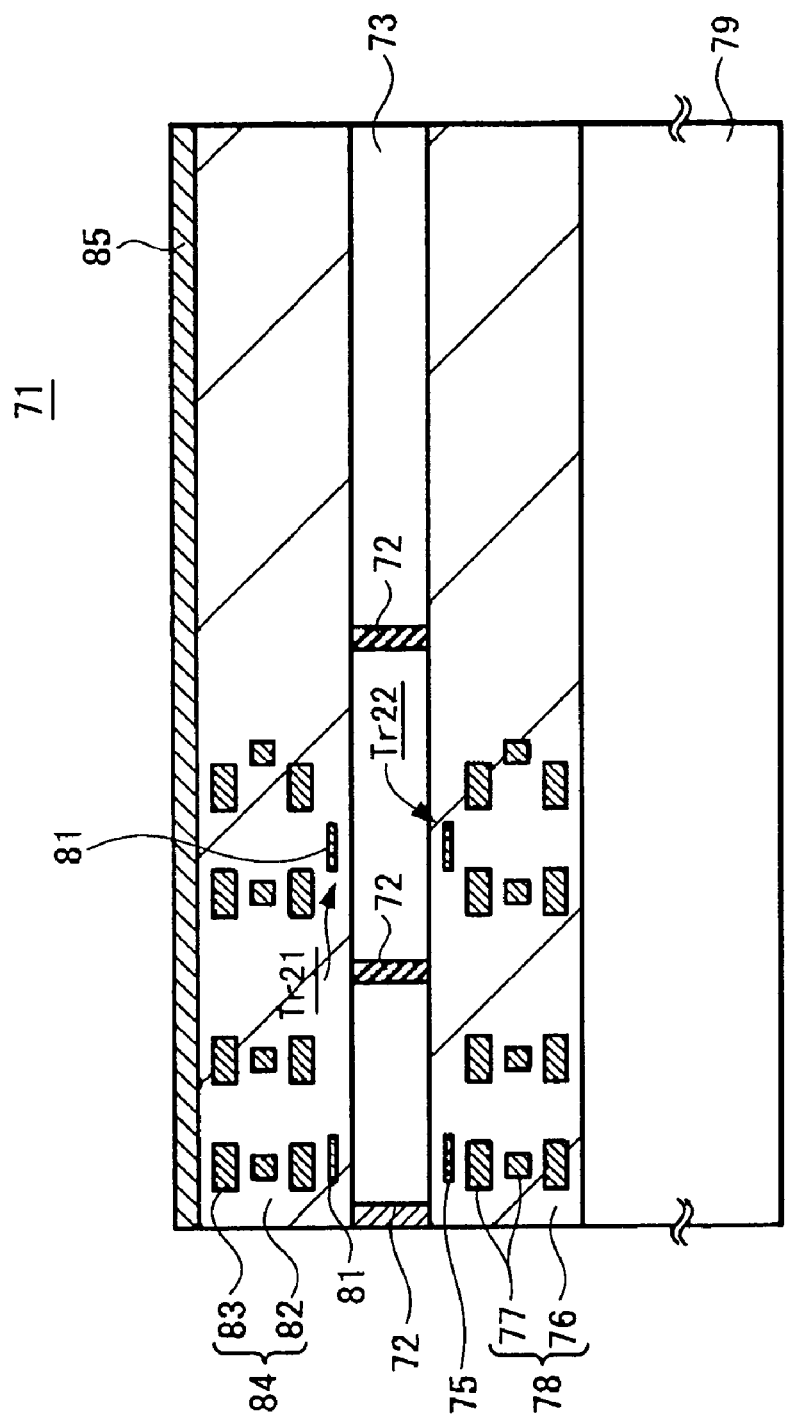
FIG. 19 is a constitutional diagram that shows a relevant portion of the semiconductor device according to the fourth embodiment of the present invention.

FIG. 19 shows the fifth embodiment of the case in which the present invention is applied to a semiconductor device, namely to a semiconductor integrated circuit device. A semiconductor integrated circuit device 71 according to this embodiment is formed such that the edge detection portion that also serves as the element separation area provided similarly to the one described above or that is provided separately from the element separation area, an edge detection portion 72 that also serves as the element separation is used in this embodiment, and a multi-layered wiring layer 78 in which a multi-layered wiring 77 is arranged through MOS transistor group Tr 22 that has a gate electrode 75 and an interlayer insulation film 76 is formed on the front surface side of a silicon substrate 73 to be made the thin film by polishing until the position where the bottom of the edge detection portion 72 is exposed by the chemical mechanical polishing method; and a support substrate 79 made of the silicon substrate, for example, is stuck to this multi-layered layer 78, and a multi-layered wiring layer 84 in which the multi-layered wiring 83 is arranged through MOS transistor group Tr 21 that has a gate electrode 81 and an interlayer insulation film 82 is formed on the rear surface side of the silicon substrate 73. A reference numeral 85 denotes a passivation film.

In FIG. 19, though the present invention is applied to the semiconductor integrated circuit device including the MOS transistor groups Tr 21, Tr 22 and the multi-layered wiring layers 78, 84 formed on both the surfaces of the silicon substrate 73 respectively, the present invention can also be applied to the semiconductor integrated circuit device of various structures such as a structure in which the MOS transistor or other semiconductor elements are formed on one side of the surfaces of the silicon substrate 73 and the wiring layer is formed on the other side of the surfaces, and the like.

In the above-described semiconductor integrated circuit device and the method for manufacturing thereof, since the SOI substrate is not required, the manufacturing process is simplified and the manufacturing cost is greatly reduced, the same operation and effectiveness as the solid-state image sensor described above can be obtained.

It should be understood by those skilled in the art that various modifications, combinations, sub-combinations and alterations may occur depending on design requirements and other factors insofar as they are within the scope of the appended claims or the equivalents thereof.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A method for manufacturing a solid-state image sensor, comprising:

forming in a semiconductor substrate an edge detection portion having a hardness larger than that of the semiconductor substrate in a thickness direction from a front surface;

forming a portion of components of the solid-state image sensor on a front surface side of said semiconductor substrate;

sticking a support substrate to the front surface side of said semiconductor substrate;

performing chemical mechanical polishing from a rear surface of said semiconductor substrate and stopping the chemical mechanical polishing in a self-aligning manner when a bottom of said edge detection portion appeared on the rear surface to make said semiconductor substrate into a thin film; and forming a remaining portion of components of the solid-state image sensor on the rear surface side of said semiconductor substrate.

2. The method for manufacturing the solid-state image sensor according to claim 1,
wherein said edge detection portion is formed to serve also as an element separation area.

3. The method for manufacturing the solid-state image sensor according to claim 1,
wherein said edge detection portion is formed with a pillar layer which is different from an element separation area.

4. The method for manufacturing the solid-state image sensor according to claim 1,
wherein said edge detection portion is formed with a length corresponding to a thickness of a photoelectric conversion element which absorbs light to perform photoelectric conversion.

5. The method for manufacturing the solid-state image sensor according to claim 3,
wherein the edge detection portions made of a plurality of said pillar layers are formed at intervals which prevent an uneven thickness from occurring in the chemical mechanical polishing.

6. A method for manufacturing a semiconductor device, comprising:
forming in a semiconductor substrate an edge detection portion having a hardness larger than that of said semiconductor substrate in a thickness direction from a front surface;
forming a portion of components of the semiconductor device on a front surface side of said semiconductor substrate;
sticking a support substrate to the front surface side of said semiconductor substrate;
performing chemical mechanical polishing from a rear surface side of said semiconductor substrate and stopping the chemical mechanical polishing in a self-aligning manner when a bottom of said edge detection portion appeared on a rear surface to make said semiconductor substrate into a thin film; and
forming a remaining other portion of components of the semiconductor device on the rear surface side of said semiconductor substrate.

7. The method for manufacturing the semiconductor device according to claim 6,
wherein said edge detection portion is formed to serve also as an element separation area.

8. The method for manufacturing the semiconductor device according to claim 6,
wherein said edge detection portion is formed with an element separation area and a pillar layer.

9. The method for manufacturing the semiconductor device according to claim 8,
the edge detection portions made of a plurality of said pillar layers are formed at intervals which prevent an uneven thickness from occurring in the chemical mechanical polishing.

* * * * *